United States Patent
Jacobsen et al.

(10) Patent No.: US 8,315,499 B1
(45) Date of Patent: Nov. 20, 2012

(54) FUNCTIONALLY-GRADED THREE-DIMENSIONAL ORDERED OPEN-CELLULAR MICROSTRUCTURE AND METHOD OF MAKING SAME

(75) Inventors: Alan J. Jacobsen, Los Angeles, CA (US); Gregory L. Olson, Whitefish, MT (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/442,777

(22) Filed: Apr. 9, 2012

Related U.S. Application Data

(62) Division of application No. 12/317,210, filed on Dec. 18, 2008, now Pat. No. 8,195,023.

(51) Int. Cl.
*G02B 6/10* (2006.01)
*G02B 6/26* (2006.01)
*B29D 11/00* (2006.01)
*G03F 7/00* (2006.01)

(52) U.S. Cl. ............ 385/146; 385/14; 385/50; 264/1.27; 430/321

(58) Field of Classification Search .................. 385/146; 264/1.27
See application file for complete search history.

(56) References Cited

U.S. PATENT DOCUMENTS

| | | | |
|---|---|---|---|
| 4,575,330 A | 3/1986 | Hull | |
| 5,006,937 A | 4/1991 | Nonoshita et al. | |
| 5,402,514 A | 3/1995 | Booth et al. | |
| 6,274,288 B1 | 8/2001 | Kewitsch et al. | |
| 6,387,593 B1 | 5/2002 | Kewitsch et al. | |
| 6,631,231 B2 | 10/2003 | Mizuuchi et al. | |
| 6,650,817 B2 | 11/2003 | Murali | |
| 6,660,192 B1 | 12/2003 | Kim et al. | |
| 6,684,007 B2 | 1/2004 | Yoshimura et al. | |
| 6,823,116 B2 | 11/2004 | Inui et al. | |
| 6,862,393 B2 | 3/2005 | Nashimoto | |
| 6,879,757 B1 | 4/2005 | Zhou et al. | |
| 6,898,362 B2 | 5/2005 | Forbes et al. | |
| 6,925,233 B2 | 8/2005 | Inui et al. | |
| 6,932,880 B2 | 8/2005 | Inui et al. | |
| 6,952,504 B2 | 10/2005 | Bi et al. | |
| 6,993,235 B2 | 1/2006 | Takagi et al. | |
| 7,006,747 B2 | 2/2006 | Escuti et al. | |
| 7,020,374 B2 | 3/2006 | Talin et al. | |

(Continued)

OTHER PUBLICATIONS

Jacobsen, et al., U.S. Appl. No. 11/580,335, filed on Oct. 13, 2006, entitled "Optically Oriented Three-Dimensional Polymer Microstructures," Application, Office Actions, Responses and Cited References.*

(Continued)

*Primary Examiner* — Omar Rojas
(74) *Attorney, Agent, or Firm* — Christie, Parker & Hale, LLP

(57) ABSTRACT

A method for creating or forming a functionally graded 3D ordered open-cellular microstructure, and a functionally graded 3D ordered open-cellular microstructure. In one embodiment, the functionally-graded three-dimensional ordered open-cellular microstructure includes a first three-dimensional interconnected pattern of polymer waveguides having a first three-dimensional pattern; a second three-dimensional interconnected pattern of polymer waveguides having a second three-dimensional pattern differing from the first three-dimensional pattern; and an interface connected with the first three-dimensional interconnected pattern of polymer waveguides and the second three-dimensional interconnected pattern of polymer waveguides. Here, the term "functionally graded" refers to a spatial variation in the physical microstructure—and thus the properties—through the thickness of the material.

16 Claims, 12 Drawing Sheets

U.S. PATENT DOCUMENTS

| | | | |
|---|---|---|---|
| 7,024,093 | B2 | 4/2006 | Shelnut et al. |
| 7,382,959 | B1 | 6/2008 | Jacobsen |
| 7,653,279 | B1 | 1/2010 | Jacobsen |
| 2004/0021237 | A1 | 2/2004 | Shimizu et al. |
| 2004/0154252 | A1 | 8/2004 | Sypeck et al. |
| 2004/0264863 | A1 | 12/2004 | Suzuki et al. |
| 2005/0135745 | A1 | 6/2005 | Greiner et al. |
| 2005/0202206 | A1 | 9/2005 | Wadley et al. |
| 2005/0255289 | A1 | 11/2005 | Wadley |
| 2005/0287696 | A1 | 12/2005 | Dumais et al. |
| 2006/0029348 | A1 | 2/2006 | Kempen et al. |
| 2006/0080835 | A1 | 4/2006 | Kooistra et al. |

OTHER PUBLICATIONS

Jacobsen, et al., U.S. Appl. No. 11/801,908, filed on May 10, 2007, entitled "Three-Dimensional Ordered Open-Cellular Structures," Application, Office Actions, Responses and Cited References.*

Jacobsen, et al., U.S. Appl. No. 12/317,210, filed Dec. 18, 2008, entitled "Functionally-Graded Three-Dimensional Ordered Open-Cellular Microstructure and Method of Making Same," Application, Office Actions, Responses and Cited References.*

Bertsch et al., "Microstereolithography: A Review", Materials Research Symposium Proceedings, 2003, 1-13, vol. 758, USA.

Chuang et al., "A New Method to Fabricate Polymer Waveguides", Progress in Electromagnetics Research Symposium, Aug. 22-26, 2005, 92-95, Hangzhou, China.

Jacobsen, A.J. et al., "Micro-scale Truss Structures formed from Self-Propagating Photopolymer Waveguides," Advanced Materials, DOI: 10.1002/adma.200700797, published online on Oct. 31, 2007, retrieved on Feb. 8, 2012 from url: http://onlinelibrary.wiley.com/doi/10.1002/adma.200700797/abstract.

Jang et al., "3D Polymer Microframes That Exploit Length-Scale-Dependent Mechanical Behavior", Advanced Materials, 2006, 2123-2127, vol. 18.

Kagami et al., "Light-Induced Self-Written Three-Dimensional Optical Waveguide", Applied Physics Letters, Aug. 20, 2001, 1079-1081, vol. 79 (No. 8), USA.

Kewitsch et al., "Nonlinear Optical Properties of Photoresists for Projection Lithography", Applied Physics Letters, Jan. 22, 1996, 455-457, vol. 68 (No. 4), USA.

Shoji et al., "Optically-Induced Growth of Fiber Patterns into a Photopolymerizable Resin", Applied Physics Letters, Aug. 2, 1999, 737-739, vol. 75 (No. 5), USA.

Sun et al., "Two-Photon Photo Polymerization and 3D Lithographic Microfabrication", APS, 2004, 169-273, vol. 170, USA.

* cited by examiner

FUNCTIONALLY-GRADED THREE-DIMENSIONAL ORDERED OPEN-CELLULAR MICROSTRUCTURE AND METHOD OF MAKING SAME

CROSS-REFERENCE TO RELATED APPLICATION(S)

This application is a divisional of U.S. patent application Ser. No. 12/317,210, filed Dec. 18, 2008, which relates to U.S. patent application Ser. No. 11/580,335, filed on Oct. 13, 2006, entitled "Optically Oriented Three-Dimensional Polymer Microstructures" and to U.S. patent application Ser. No. 11/801,908, filed on May 10, 2007, entitled "Three-Dimensional Ordered Open-Cellular Structures." The entire contents of each of the above-referenced applications are incorporated herein by reference.

FIELD OF THE INVENTION

The present invention relates to a three-dimensional (3D) ordered open-cellular microstructure and a method to fabricate such a material. In particular, the present invention relates to a functionally graded 3D ordered open-cellular microstructure and a method of making the same.

BACKGROUND OF THE INVENTION

A three-dimensional (3D) ordered open-cellular microstructure is an ordered 3D structure at the micrometer scale. Aspects of embodiments of the present invention are directed toward a functionally graded 3D ordered open-cellular microstructure and a method of making the same. Here, the term "functionally graded" refers to a spatial variation in the physical microstructure—and thus the properties—through the thickness of the material.

A 3D ordered open-cellular microstructure can be formed, for example, by using a stereolithography technique, which relies on a bottom-up, layer-by-layer approach. This process usually involves a platform (substrate) that is lowered into a photo-monomer (photopolymer) bath in discrete steps. At each step, a laser is scanned over the area of the photo-monomer that is to be cured (polymerized) for that particular layer. Once the layer is cured, the platform is lowered a specific amount (determined by the processing parameters and desired feature/surface resolution) and the process is repeated until the full 3D structure is created.

One example of such a stereolithography technique is disclosed in Hull et al., "Apparatus For Production Of Three-Dimensional Objects By Stereolithography," U.S. Pat. No. 4,575,330, Mar. 11, 1986, which is incorporated by reference herein in its entirety.

Modifications to the above described stereolithography technique have been developed to improve the resolution with laser optics and special resin formulations, as well as modifications to decrease the fabrication time of the 3D structure by using a dynamic pattern generator to cure an entire layer at once. One example of such a modification is disclosed in Bertsch et al., "Microstereolithography: A Review," Materials Research Society Symposium Proceedings, Vol. 758, 2003, which is incorporated by reference herein in its entirety. A fairly recent advancement to the standard stereolithography technique includes a two-photon polymerization process as disclosed in Sun et al., "Two-Photon Polymerization And 3D Lithographic Microfabrication," APS, Vol. 170, 2004, which is incorporated by reference herein in its entirety. However, this advance process still relies on a complicated and time consuming layer-by-layer approach.

Previous work has also been done on creating polymer optical waveguides. A polymer optical waveguide can be formed in certain photopolymers that undergo a refractive index change during the polymerization process. If a monomer that is photo-sensitive is exposed to light (typically UV) under the right conditions, the initial area of polymerization, such as a small circular area, will "trap" the light and guide it to the tip of the polymerized region due to this index of refraction change, further advancing that polymerized region. This process will continue, leading to the formation of a waveguide structure with approximately the same cross-sectional dimensions along its entire length. The existing techniques to create polymer optical waveguides have only allowed one or a few waveguides to be formed and these techniques have not been used to create a self-supporting three-dimensional structure by patterning polymer optical waveguides.

In addition, functionally graded foams with random cell configurations have been fabricated through various techniques and are discussed in Lefebvre et al., "Method Of Making Open Cell Material," U.S. Pat. No. 7,108,828, Sep. 19, 2006; in Lauf et al., "Method Of Making A Functionally Graded Material," U.S. Pat. No. 6,375,877, Apr. 23, 2002; and in Vyakarnam et al., "Porous Tissue Scaffoldings For The Repair Or Regeneration Of Tissue," U.S. Pat. No. 6,534,084, Mar. 18, 2003; the entire contents of each of which are incorporated herein by reference. However, these functionally graded structures with specifically designed and ordered microstructures rely on layer-by-layer approaches similar to the above discussed stereolithography techniques, an example of which is also discussed in Keicher et al., "Forming Structures From CAD Solid Models", U.S. Pat. No. 6,391,251, May 21, 2002, which is incorporated herein by reference in its entirety. These above cited references do not, however, disclose or discuss a manufacturing technique for 3D patterning of self-propagating polymer optical waveguides to form functionally graded open-cellular microstructures.

As such, there continues to be a need for 3D patterning of self-propagating polymer optical waveguides to form functionally graded 3D ordered open-cellular microstructures (or open-cellular materials) on a large and useful scale using a simple technique.

SUMMARY OF THE INVENTION

An aspect of an embodiment of the present invention is directed toward a method for creating or forming a functionally graded 3D ordered open-cellular microstructure.

Another aspect of an embodiment of the present invention is directed toward a functionally graded 3D ordered open-cellular microstructure.

An embodiment of the present invention provides a method for forming a functionally-graded three-dimensional ordered open-cellular microstructure. The method includes: securing a volume of photo-monomer; exposing the volume of photo-monomer to a first three-dimensional light pattern and a second three-dimensional light pattern differing from the first three-dimensional light pattern, wherein the first three-dimensional light pattern and the second three-dimensional light pattern are exposed on opposite exposure surfaces of the volume of photo-monomer, wherein the first three-dimensional light pattern creates a first three-dimensional interconnected pattern of polymer waveguides in the volume of photo-monomer, wherein the second three-dimensional light pattern creates a second three-dimensional interconnected pattern of polymer waveguides in the volume of photo-monomer, and wherein an exposure energy of each of the light patterns is sufficient to at least connect the first three-dimensional interconnected pattern of polymer waveguides to the second three-dimensional interconnected pattern of polymer waveguides; and removing any uncured photo-monomer to leave behind the functionally-graded three-dimensional ordered open-cellular microstructure.

In one embodiment, the exposure energy of each of the light patterns determines a thickness into the volume of photo-monomer of each of the interconnected patterns of polymer waveguides originating from a respective one of the exposure surfaces of the photo-monomer.

In one embodiment, the exposing the volume of photo-monomer to the first three-dimensional light pattern and the second three-dimensional light pattern includes: securing a first mask at a first one of the opposite exposure surfaces of the volume of photo-monomer, the first mask having a plurality of first apertures arranged in a first mask pattern; and securing a second mask at a second one of the opposite exposure surfaces of the volume of photo-monomer, the second mask having a plurality of second apertures arranged in a second mask pattern differing from the first mask pattern. The securing the first mask at the first one of the opposite exposure surfaces of the photo-monomer may include placing the first mask between a first collimated light source and the first one of the opposite exposure surfaces of the photo-monomer, and the securing the second mask at the second one of the opposite exposure surfaces of the photo-monomer may include placing the second mask between a second collimated light source and the second one of the opposite exposure surfaces of the photo-monomer.

In one embodiment, the exposing the volume of photo-monomer to the first three-dimensional light pattern and the second three-dimensional light pattern includes: directing a plurality of first collimated light beams from the first collimated light source to the first mask for a period of exposure time such that a portion of the first collimated light beams passes through the plurality of first apertures of the first mask into the photo-monomer to form the first three-dimensional interconnected pattern of polymer waveguides through a first portion of the volume of the photo-monomer; and directing a plurality of second collimated light beams from the second collimated light source to the second mask for a period of exposure time such that a portion of the second collimated light beams passes through the plurality of second apertures of the first mask into the photo-monomer to form the second three-dimensional interconnected pattern of polymer waveguides through a second portion of the volume of the photo-monomer. The directing the plurality of first collimated light beams from the first collimated light source to the first mask may include directing a first one of the plurality of first collimated light beams at a first angle with respect to the first mask, directing a second one of the plurality of first collimated light beams at a second angle with respect to the first mask, and directing a third one of the plurality of first collimated light beams at a third angle with respect to the first mask; and the directing the plurality of second collimated light beams from the second collimated light source to the second mask may include directing a first one of the plurality of second collimated light beams at a fourth angle with respect to the second mask, directing a second one of the plurality of second collimated light beams at a fifth angle with respect to the second mask, and directing a third one of the plurality of second collimated light beams at a sixth angle with respect to the second mask.

In one embodiment, the first angle is different from the fourth angle, the second angle is different from the fifth angle, and/or the third angle is different from the sixth angle; and the plurality of first apertures is substantially identical in number to the plurality of second apertures.

In one embodiment, the first angle is substantially identical to the fourth angle, the second angle is substantially identical to the fifth angle, and the third angle is substantially identical to the sixth angle; and the plurality of first apertures is different in number to the plurality of second apertures.

In one embodiment, the first angle is different from the fourth angle, the second angle is different from the fifth angle, and/or the third angle is different from the sixth angle; and the plurality of first apertures is different in number to the plurality of second apertures.

In one embodiment, the first collimated light source includes three or more light sources adapted to produce the first, second and third ones of the plurality of first collimated light beams, and the second collimated light source includes three or more light sources adapted to respectively produce the first, second and third ones of the plurality of second collimated light beams. The first three-dimensional interconnected pattern of polymer waveguides and the second three-dimensional interconnected pattern of polymer waveguides may be formed from a concurrent exposure of the first, second and third ones of the plurality of first collimated light beams and the first, second and third ones of the plurality of second collimated light beams.

In one embodiment, the exposing the volume of photo-monomer to the first three-dimensional light pattern and the second three-dimensional light pattern further includes: directing three or more first collimated light beams from the first collimated light source to the first mask for a period of exposure time such that a portion of the first collimated light beams passes through the plurality of first apertures of the first mask into the photo-monomer to form the first three-dimensional interconnected pattern of polymer waveguides through a first portion of the volume of the photo-monomer; and directing three or more second collimated light beams from the second collimated light source to the second mask for a period of exposure time such that a portion of the second collimated light beam passes through the plurality of second apertures of the second mask into the photo-monomer to form the second three-dimensional interconnected pattern of polymer waveguides through a second portion of the volume of the photo-monomer.

In one embodiment, the second three-dimensional interconnected pattern of polymer waveguides is formed entirely within the first three-dimensional interconnected pattern of polymer waveguides. Here, the first three-dimensional interconnected pattern of polymer waveguides and the second three-dimensional interconnected pattern of polymer waveguides may be substantially identical in volume.

In one embodiment, the second three-dimensional interconnected pattern of polymer waveguides has a first portion formed within the first three-dimensional interconnected pattern of polymer waveguides and a second portion formed outside of the first three-dimensional interconnected pattern of polymer waveguides.

An embodiment of the present invention provides a system for forming a functionally-graded three-dimensional ordered open-cellular microstructure. The system includes a reservoir, a first patterning apparatus, and a second patterning apparatus. The reservoir has a volume of photo-monomer adapted to polymerize by the collimated light beams. The first patterning apparatus is adapted to expose the volume of photo-monomer to a first three-dimensional light pattern. The second patterning apparatus is adapted to expose the volume of photo-monomer to a second three-dimensional light pattern. Here, the first three-dimensional light pattern and the second three-dimensional light pattern are exposed on opposite exposure surfaces of the volume of photo-monomer, the first three-dimensional light pattern creates a first three-dimensional interconnected pattern of polymer waveguides, the second three-dimensional light pattern creates a second three-dimensional interconnected pattern of polymer waveguides, and an exposure energy of each of the light patterns is sufficient to at least connect the first three-dimensional interconnected pattern of polymer waveguides to the second three-dimensional interconnected pattern of polymer waveguides.

In one embodiment, the exposure energy of each of the light patterns determines a thickness into the volume of photo-monomer of each of the interconnected patterns of polymer waveguides formed starting at a respective one of the exposure surfaces of the photo-monomer.

In one embodiment, the first patterning apparatus includes a first collimated light source adapted to produce a plurality of first collimated light beams, and a first mask disposed between the first collimated light source and a first one of the opposite exposure surfaces of the volume of photo-monomer, the first mask having a plurality of first apertures with a first mask pattern. The second patterning apparatus includes a second collimated light source adapted to produce a plurality of second collimated light beams, and a second mask disposed between the second collimated light source and a second one of the opposite exposure surfaces of the volume of photo-monomer, the second mask having a plurality of second apertures with a second mask pattern.

In one embodiment, the first collimated light source may include a plurality of first light sources adapted to respectively produce the plurality of first collimated beams, and the second collimated light source may include a plurality of second light sources adapted to respectively produce the plurality of second collimated beams.

In one embodiment, the plurality of first collimated beams includes a first beam directed at a first angle with respect to the first mask, a second beam directed at a second angle with respect to the first mask, and a third beam directed at a third angle with respect to the first mask. The plurality of second collimated beams includes a fourth beam directed at a fourth angle with respect to the second mask, a fifth beam directed at a fifth angle with respect to the second mask, and a sixth beam directed at a sixth angle with respect to the second mask.

In one embodiment, the first angle is different from the fourth angle, the second angle is different from the fifth angle, and/or the third angle is different from the sixth angle; and the plurality of first apertures is substantially identical in number to the plurality of second apertures.

In one embodiment, the first angle is substantially identical to the fourth angle, the second angle is substantially identical to the fifth angle, and the third angle is substantially identical to the sixth angle; and the plurality of first apertures is different in number to the plurality of second apertures.

In one embodiment, the first angle is different from the fourth angle, the second angle is different from the fifth angle, and/or the third angle is different from the sixth angle; and the plurality of first apertures is different in number to the plurality of second apertures.

In one embodiment, the second three-dimensional interconnected pattern of polymer waveguides is formed entirely within the first three-dimensional interconnected pattern of polymer waveguides. Here, the first three-dimensional interconnected pattern of polymer waveguides and the second three-dimensional interconnected pattern of polymer waveguides may be substantially identical in volume.

In one embodiment, the second three-dimensional interconnected pattern of polymer waveguides has a first portion formed within the first three-dimensional interconnected pattern of polymer waveguides and a second portion formed outside of the first three-dimensional interconnected pattern of polymer waveguides.

An embodiment of the present invention provides a functionally-graded three-dimensional ordered open-cellular microstructure. The functionally-graded three-dimensional ordered open-cellular microstructure includes a first three-dimensional interconnected pattern of polymer waveguides having a first three-dimensional pattern; a second three-dimensional interconnected pattern of polymer waveguides having a second three-dimensional pattern differing from the first three-dimensional pattern; and an interface connected with the first three-dimensional interconnected pattern of polymer waveguides and the second three-dimensional interconnected pattern of polymer waveguides.

In one embodiment, the interface is a third three-dimensional interconnected pattern of polymer waveguides having a third three-dimensional pattern differing from the first three-dimensional pattern and the second three-dimensional pattern.

In one embodiment, the first and second three-dimensional patterns have order in three dimensions.

In one embodiment, the functionally-graded three-dimensional ordered open-cellular also includes: a plurality of first truss elements defined by a plurality of first self-propagating polymer waveguides of the first three-dimensional interconnected pattern of polymer waveguides and extending along a first direction; a plurality of second truss elements defined by a plurality of second self-propagating polymer waveguides of the first three-dimensional interconnected pattern of polymer waveguides and extending along a second direction; a plurality of third truss elements defined by a plurality of third self-propagating polymer waveguides of the first three-dimensional interconnected pattern of polymer waveguides and extending along a third direction; a plurality of fourth truss elements defined by a plurality of fourth self-propagating polymer waveguides of the second three-dimensional interconnected pattern of polymer waveguides and extending along a fourth direction; a plurality of fifth truss elements defined by a plurality of fifth self-propagating polymer waveguides of the second three-dimensional interconnected pattern of polymer waveguides and extending along a fifth direction; and a plurality of sixth truss elements defined by a plurality of sixth self-propagating polymer waveguides of the second three-dimensional interconnected pattern of polymer waveguides and extending along a sixth direction. The first, second, and third truss elements interpenetrate each other at a plurality of first nodes to form a first continuous material, the fourth, fifth, and sixth truss elements interpenetrate each other at a plurality of second nodes to form a second continuous material, and the interface includes a plurality of third nodes for connecting the first continuous material to the second continuous material.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Further, the dimensions of layers and other elements shown in the accompanying drawings may be exaggerated to more clearly show details. As such, the drawings and description are to be regarded as illustrative in nature and not restrictive.

Embodiments of the present invention relate to a functionally graded material with an ordered open-cellular three-dimensional (3D) microstructure and a method to fabricate such a material. Here, the term "functionally graded" refers to a spatial variation in the physical microstructure—and thus the properties—through the thickness of the material.

Figure 1:
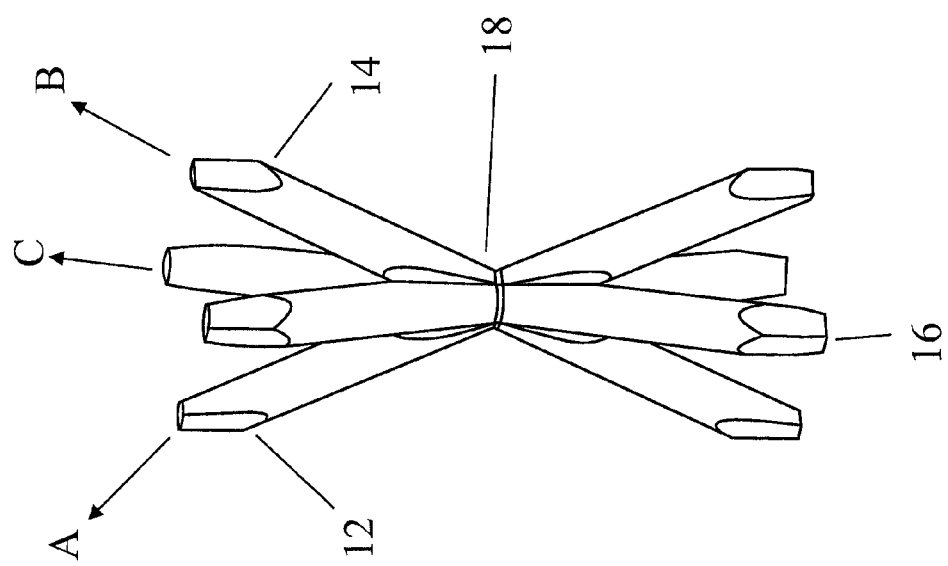
FIG. 1 is a perspective schematic view of a portion of a structure according to an embodiment of the present invention.
Figure 1:
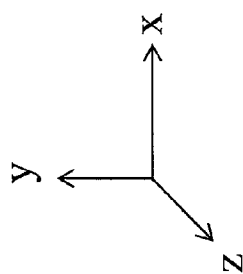
Figure 2:
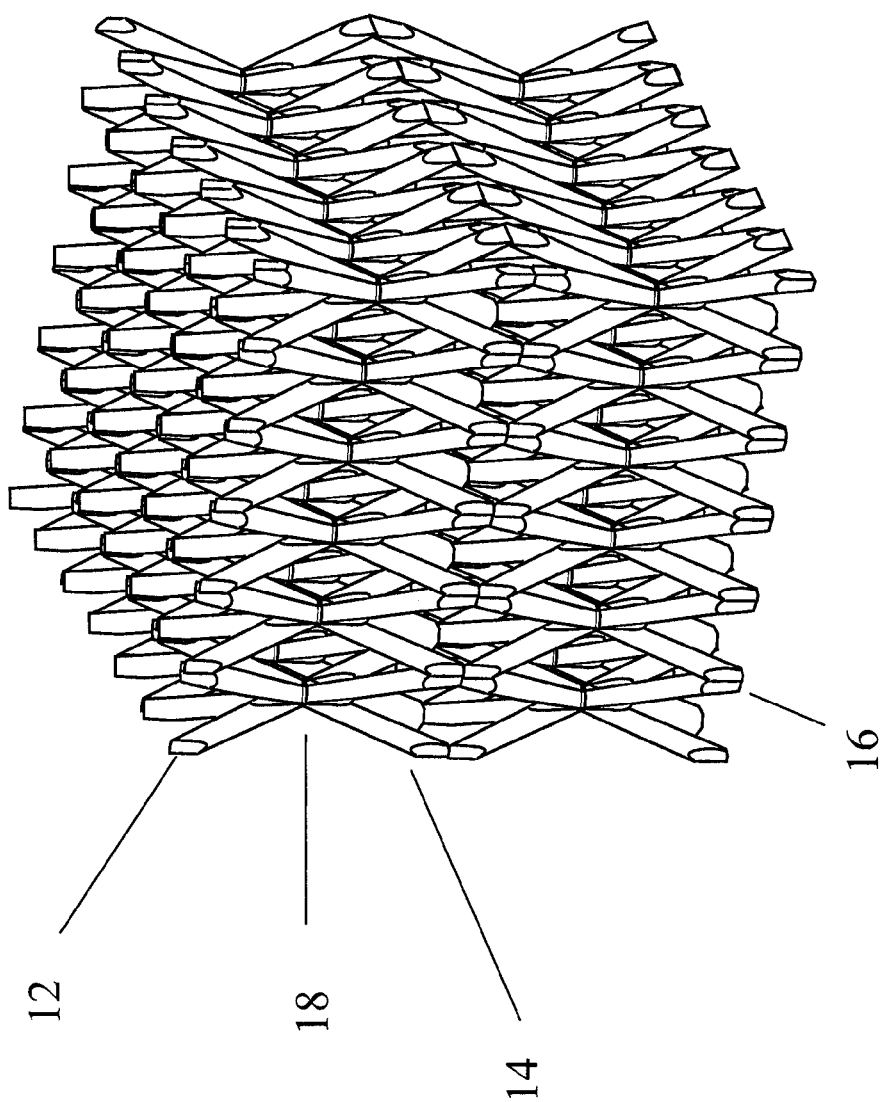
FIG. 2 is a perspective schematic view of a structure according to an embodiment of the present invention.

Referring to FIGS. 1 and 2, a 3D ordered open-cellular microstructure 10 according to an embodiment of the present invention is a self-supporting structure. In one embodiment of the present invention, this 3D ordered open-cellular microstructure 10 can be extended to form a functionally graded 3D ordered open-cellular microstructure that has a spatial variation in the physical microstructure—and thus the properties—through the thickness of the material of the microstructure. That is, the process to form this functionally graded 3D ordered open-cellular microstructure is an extension of the process to form the 3D ordered open-cellular microstructure 10. In more detail, the 3D ordered open-cellular microstructure 10 includes first truss elements 12, second truss elements 14, and third truss elements 16. The first truss elements 12 are defined by first self-propagating polymer waveguides and extend along a first direction A. The second truss elements 14 are defined by second self-propagating polymer waveguides and extend along a second direction B. The third truss elements 16 are defined by third self-propagating polymer waveguides and extend along a third direction C. With reference to FIGS. 1 and 2, the truss elements 12, 14, 16 interpenetrate each other at nodes 18 to form a continuous material.

In one embodiment, the truss elements 12, 14, 16 include a photo-polymer material. In one embodiment, the truss elements 12, 14, 16 are polymer optical waveguide truss elements.

In one embodiment, the continuous material is continuously formed such that it lacks any interior boundaries, e.g., boundaries within the interpenetrating portions of truss elements 12, 14, 16. In another embodiment, each node 18 of the structure 10 is formed of the continuous material.

According to one embodiment of the present invention, the 3D ordered open-cellular microstructure 10 is formed by using a fixed light input (collimated UV light) to cure (polymerize) polymer optical waveguides, which can self-propagate in a 3D pattern. As such, the propagated polymer optical waveguides form the 3D ordered open-cellular microstructure 10.

As disclosed in Monro et al. "Topical Review Catching Light In Its Own Trap," Journal Of Modern Optics, 2001, Vol. 48, No. 2, 191-238, which is incorporated by reference herein in its entirety, some liquid polymers, referred to as photopolymers, undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a waveguide structure with approximately the same cross-sectional dimensions along its entire length.

According to one embodiment of the present invention, a mask with a two-dimensional pattern of apertures (see FIG. 3) is used to create a 3D ordered open-cellular microstructure (or a 3D polymer microstructure).

Figure 3:
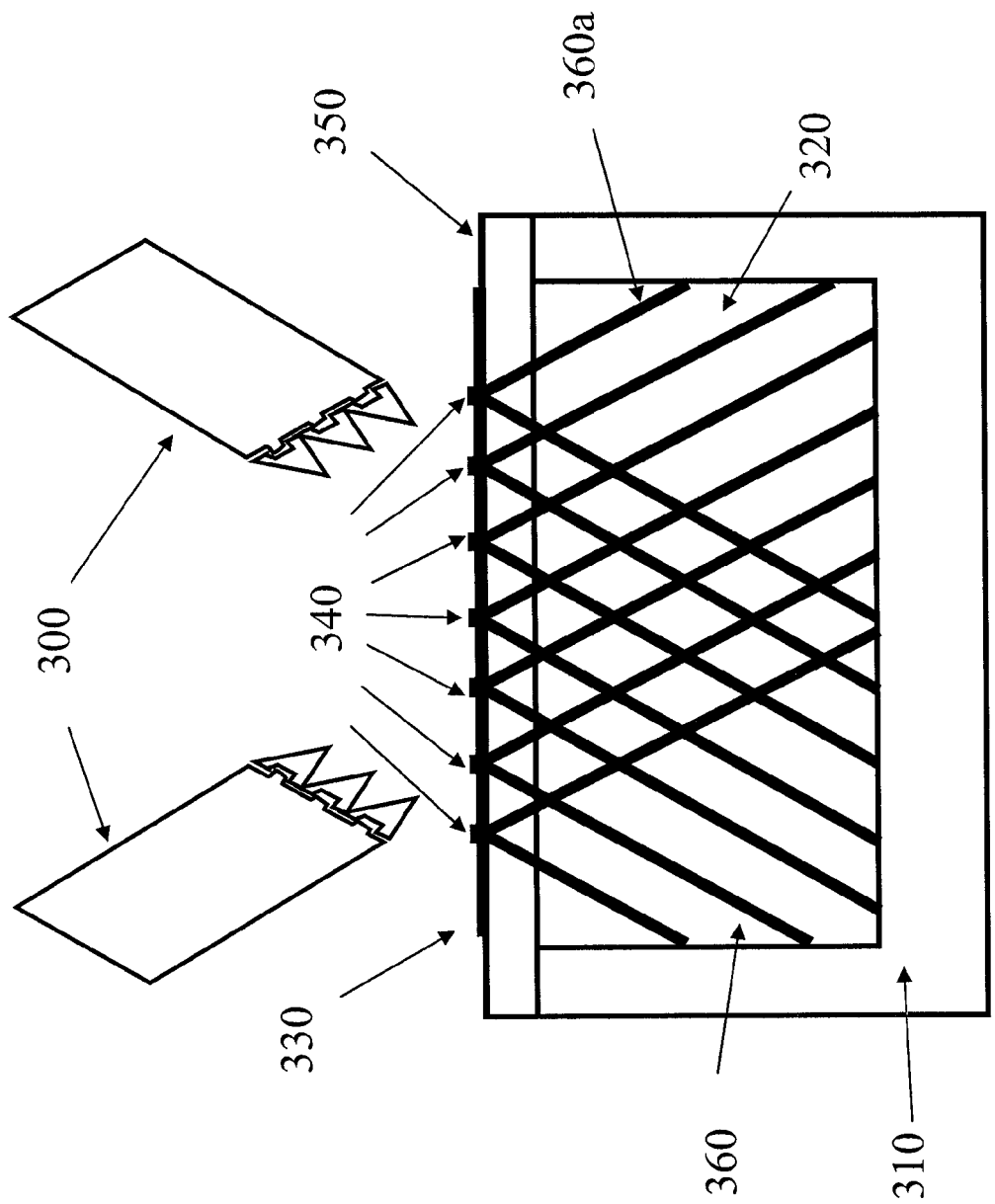
FIG. 3 is a schematic diagram of a system for forming a structure of an embodiment of the present invention from multiple waveguides created using a single collimated beam or multiple collimated beams through multiple apertures.
Figure 4B:
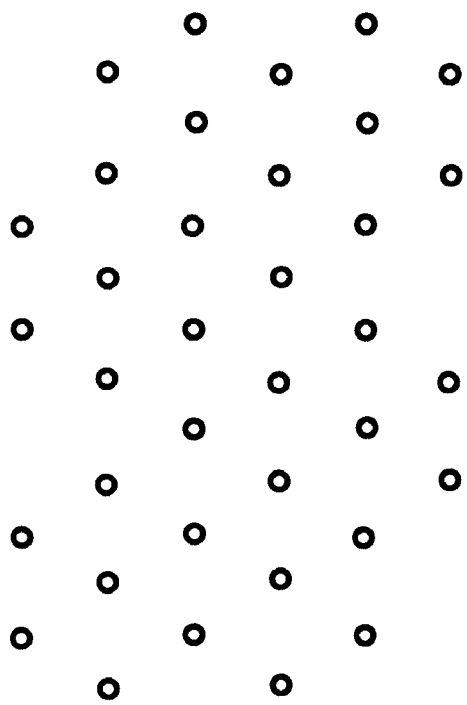
FIG. 4b illustrates an example of a hexagonal mask pattern (or a hexagonal mask aperture pattern) according to embodiments of the present invention.
Figure 4A:
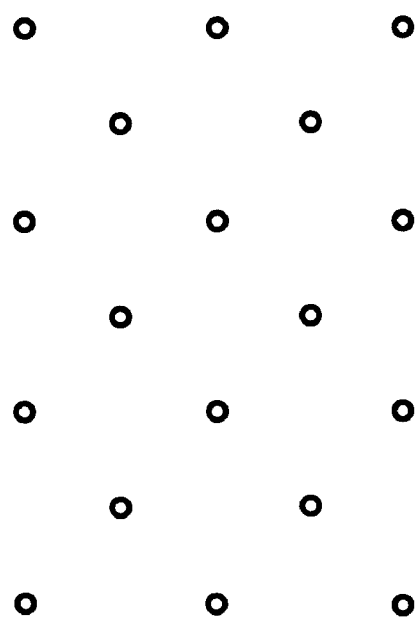
FIG. 4a illustrates an example of a square mask pattern (or a square mask aperture pattern) according to embodiments of the present invention.

With reference to FIG. 3, a system for forming a 3D polymer microstructure according to an embodiment of the present invention includes one or more collimated light sources 300, a reservoir (mold) 310 having a volume of monomer 320 that will polymerize at a wavelength of collimated light beams provided by the light sources 300, and a patterning apparatus, such as a mask 330 with multiple apertures (open areas) 340. Each of the apertures 340 has a given shape and dimension substantially matching a cross-section geometry of a waveguide (e.g., waveguide 360a). Between the mask 330 and the monomer 320, there may be a substrate 350. Here, in FIG. 3, a truly 3D network can be formed because the intersecting polymer waveguides 360 will simply polymerize together, but will not interfere with waveguide propagation. Also, the spacing between the plurality of waveguides 360 corresponds with the pattern of the plurality of apertures 340. The pattern of the apertures 340 may, for example, be in a square pattern as shown in FIG. 4a and/or in a hexagonal pattern as shown in FIG. 4b. The hole (aperture) spacing, i.e., distance between apertures 340 in the mask 330, and the number of waveguides 360 formed from each of the apertures 340 will determine the open volume fraction (i.e. open space) of the formed 3D microstructure. FIGS. 4A and B show arrows for indicating the direction of illumination to create either a four waveguide structure (FIG. 4A) or a three waveguide structure (FIG. 4B).

As such, through the system of FIG. 3, a 3D polymer microstructure (or a 3D ordered polymer microstructure) of an embodiment of the present invention can be designed for a given application. The design parameters include: 1) the angle and pattern of the polymer waveguides with respect to one another, 2) the packing, or relative density of the resulting cellular structure (or the open volume fraction), and 3) the cross-sectional shape and dimensions of the polymer waveguides.

Figure 5:
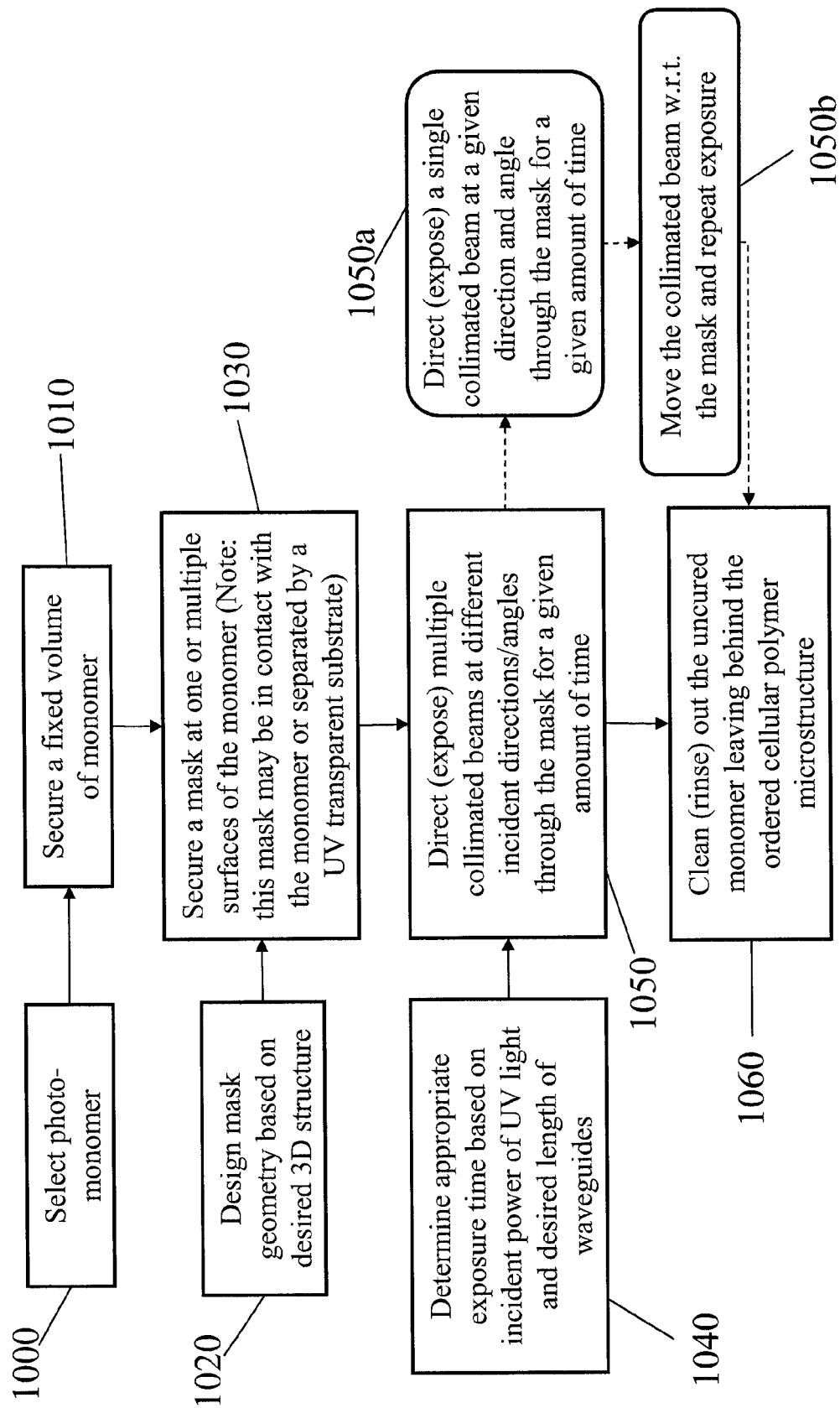
FIG. 5 is a process flow diagram for forming one or more polymer waveguides of a structure according to an embodiment of the present invention.

In more detail, FIG. 5 shows a method of forming a 3D ordered polymer microstructure according to an embodiment of the present invention. As illustrated in FIG. 5, a photomonomer is selected in block 1000. In block 1010, a volume of the selected photo-monomer is secured (e.g., in a reservoir). A mask geometry is designed based on a desired 3D ordered polymer microstructure in block 1020. A patterning apparatus, such as a mask having the designed geometry, is secured in block 1030. Here, the secured mask has at least one aperture between at least one collimated light source and the volume of the selected photo-monomer. In addition, the mask may be in contact with the monomer or separated by a substrate (e.g., by a UV transparent substrate).

In block 1040, an appropriate exposure time is determined based on incident power of a collimated light beam from the at least one collimated light source (e.g., an incident power of a UV light) and a desired length of one or more waveguides. The collimated light beam from the at least one collimated light source is directed to the mask for a period of exposure time so that a portion of the collimated beam passes through the mask and is guided by the at least one aperture into the photo-monomer to form at least one waveguide through a portion of the volume of the photo-monomer. Here, the at least one waveguide has a cross-sectional geometry substantially matching the designed aperture geometry on the mask.

In one embodiment as shown in block 1050, multiple collimated beams at different incident directions and/or angles are directed through the mask for a given amount of time.

Alternatively, as shown in blocks 1050a, a single collimated beam at a given direction and angle is directed through the mask for a given amount of time. Then, at block 1050b, the collimated light beam is moved with respect to the mask and the exposure is repeated.

Then, at block 1060, any uncured photo-monomer is removed to leave behind a 3D ordered polymer microstructure. Here, in one embodiment, the plurality of polymer waveguides are used to form the 3D ordered polymer microstructure, and the 3D ordered polymer microstructure corresponds with the pattern of the plurality of apertures.

The resulting 3D ordered polymer microstructure can be formed in seconds in the area where exposed to the incident collimated beam. Since the incident light and the monomer remain fixed with respect to one another during the formation of a polymer waveguide, the exposure area of the collimated beam(s) can be scanned over a larger surface area of monomer, leading to the formation of large-area structures. Alternatively, in one embodiment, a volume of monomer can continuously be fed under a fixed incident light pattern (created from a mask and collimated light) leading to a path for mass production.

As described, once the polymer cellular structure is formed in the volume of monomer, the remaining un-polymerized material (monomer) is removed leaving an open cellular polymer material that is the ordered 3D microstructure. By way of example, a solvent that dissolves the monomer (but not the polymer) may be used to aid in the monomer removal.

With reference back to FIGS. 1 and 2, the truss elements 12, 14, 16 of the microstructure 10 define an open volume (i.e. free space) of the microstructure 10. In one embodiment, the microstructure 10 defines a free space of not less than about 40% by volume and not greater than about 99% by volume. In another embodiment, the structure 10 defines a free space of not less than about 70% by volume and not greater than about 95% by volume.

The truss elements 12, 14, 16 intersect at the nodes 18 to form symmetrical angles in three dimensions (three orthogonal directions). The symmetrical angles relative to the xz-plane (see, FIG. 1), can measure between 0° and 90°. That is, truss elements 12, 14, 16 interpenetrate each other to form "perfect" nodes: each of the truss elements 12, 14, 16 defines an angle relative to a compression surface of the microstructure 10 (e.g. a surface extending along a direction of the xz-plane), and the respective angles defined by the truss elements 12, 14, 16 are substantially equal to one another. However, embodiments of the present invention are not limited thereto.

The truss elements 12, 14, 16 have an intrinsically high strength due to their small scale. In one embodiment, each of the truss elements 12, 14, 16 has an axial diameter of not greater than about 500 µm.

In another embodiment, each of the truss elements 12, 14, 16 has an axial diameter of not greater than about 200 µm. In another embodiment, each of the truss elements 12, 14, 16 has an axial diameter of not greater than about 1 µm. The truss elements 12, 14, 16 are configured to have a correspondingly small aspect ratio (e.g., length/diameter ratio) for withstanding a bending moment. Here, each of the truss elements 12, 14, 16 has a length not greater than 100 µm such that the truss elements can better withstand a mechanical load applied to the microstructure 10. As such, the truss elements 12, 14, 16 experience little, if any, bending deformation during application of the mechanical load to the structure 10.

At certain size scales (e.g., the size scales described above), the strength of the truss elements is increased, which corresponds to an increased strength of the microstructure 10. In one embodiment, each of the truss elements 12, 14, 16 has molecular alignment extending along an axial direction of the truss element. As such, an anisotropic material is produced, which provides a substantial degree of stiffness and/or strength along the axial direction. In one embodiment, in a material that is composed of long molecular chains (e.g., polymers), the molecules thereof can be aligned along a direction to provide an increased degree of mechanical strength and/or stiffness along the alignment direction. In more detail, where the molecular alignments of the truss elements 12, 14, 16 extend along the corresponding axial directions, the truss elements 12, 14, 16 are configured to axially transfer a mechanical load applied to the structure 10.

As described above, the microstructure 10 withstands the mechanical load, e.g., via axial tension and compression of the truss elements 12, 14, 16. Molecular alignment of the truss elements 12, 14, 16 along their respective axial directions lends additional strength and/or stiffness to the truss elements 12, 14, 16 and, accordingly, also to the microstructure 10.

In one embodiment, the truss elements 12, 14, 16 are configured to provide the microstructure 10 with a stretch-dominated behavior under a compression load applied to the microstructure 10. Such stretch-dominated behavior is contrasted from the bending-dominated behavior (e.g. of randomly oriented cellular structures), as described in Ashby, "The Properties Of Foam And Lattices," Philosophical Transactions—Royal Society Of London Series A Mathematical Physical And Engineering Sciences, Vol. 364, 2006, which is incorporated by reference herein in its entirety.

In a bending-dominated structure, the elastic modulus is proportional to the square of the relative density $\rho'/\rho_s'$, where $\rho'$ is the density of the cellular material and $\rho_s'$ is the density of the solid from which it is constructed. In contrast, a stretch-dominated structure (such as microstructure 10), has a compressive elastic modulus (E) directly proportional to both the relative density thereof and the modulus ($E_s$) of the solid material portion of the microstructure 10, as expressed in equation (1) below:

$$E=E_s(\sin^4\theta)(\rho/\rho_s) \qquad (1)$$

where $\rho$ is a density of the structure 10, $\rho_s$ is a density of a solid material portion of the microstructure 10, $\theta$ is an angle of at least one of the truss elements 12, 14, 16 relative to a compression surface of the microstructure 10, and $E_s$ is a modulus of the solid material portion of the microstructure 10. As such, the elastic modulus of a structure of embodiments of the present invention is also proportional to a geometric function of the angle $\theta$ of the structure, and $\theta$ can accordingly be chosen to vary (e.g., increase or reduce) the elastic modulus.

Figure 6:
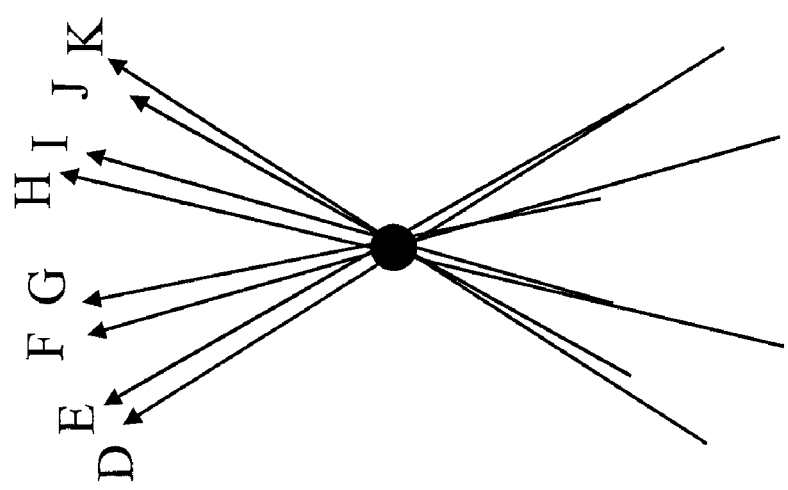
FIG. 6 is a perspective schematic view showing respective directions along which truss elements of a structure of an embodiment of the present invention extend.

With reference back to FIGS. 1 and 2, the microstructure 10 includes truss elements 12, 14, 16 respectively extending along A, B, and C directions. However, embodiments of the present invention are not limited thereto. For example, with reference to FIG. 6, a 3D ordered open-cellular microstructure of an embodiment of the present invention may include truss elements defined by self-propagating polymer waveguides and extending along D, E, F, G, H, I, J and K directions, respectively. For example, a 3D ordered open-cellular microstructure according to an embodiment of the present invention may include eight truss elements, each of which extends along a corresponding one of eight varying directions. Here, similar to the embodiment shown in FIGS. 1 and 2, the eight truss elements interpenetrate each to form nodes of a continuous material. However, embodiments of the present invention are not limited thereto, and may include more or fewer than eight truss elements.

In a further embodiment of the present invention, an open volume of a 3D ordered open-cellular microstructure is filled at least partially with a material different from the material of the 3D ordered open-cellular microstructure itself, thereby creating an ordered bi-phase composite. Also in a further embodiment of the present invention, one or more truss elements of a 3D ordered open-cellular microstructure are coated with a material different from the material of the cellular structural itself to adjust the physical properties and behavior thereof. The physical properties that may be adjusted include, but without limitation, the thermal properties, mechanical properties, and electrical properties. Also in a further embodiment of the present invention, base elements of a 3D ordered open-cellular microstructure are coated with a material different from the material of the cellular structural itself, and the base elements are removed to create a self-supporting structure having continuous but separated volumes.

In one embodiment, a method to create a functionally graded material with an ordered open-cellular 3D microstructure involves creating multiple interconnected patterns of self-propagating polymer optical waveguides in the appropriate photomonomer. In the method as shown and described in FIG. 5, a volume of monomer was exposed to a 3D pattern of light creating an interconnected pattern of polymer waveguides, which results in a self-supporting material with an ordered open-cellular microstructure. The microstructures discussed in FIG. 5 may have a variable pattern in a planar direction of the material (i.e. X-Y plane); however, these structures will maintain an approximately constant cross-section through the thickness of the material (i.e. Z-direction) due to the ability of these polymer waveguides to propagate with a constant cross-section over a length much greater than the cross-sectional dimensions (>10×).

Figure 7:
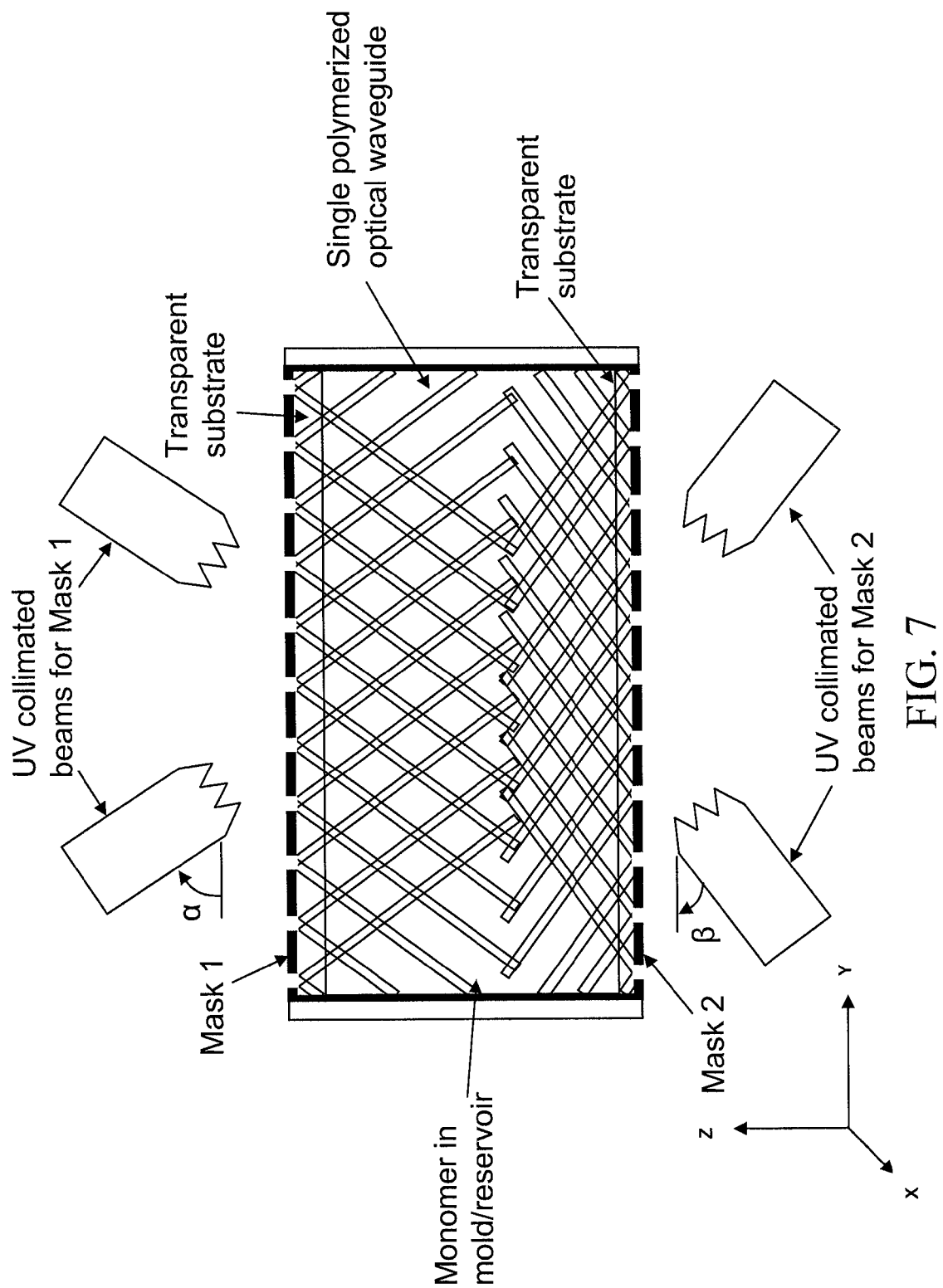
FIG. 7 is schematic diagram of a system for forming a functionally graded 3D ordered open-cellular microstructure according to an embodiment of the present invention.
Figure 8:
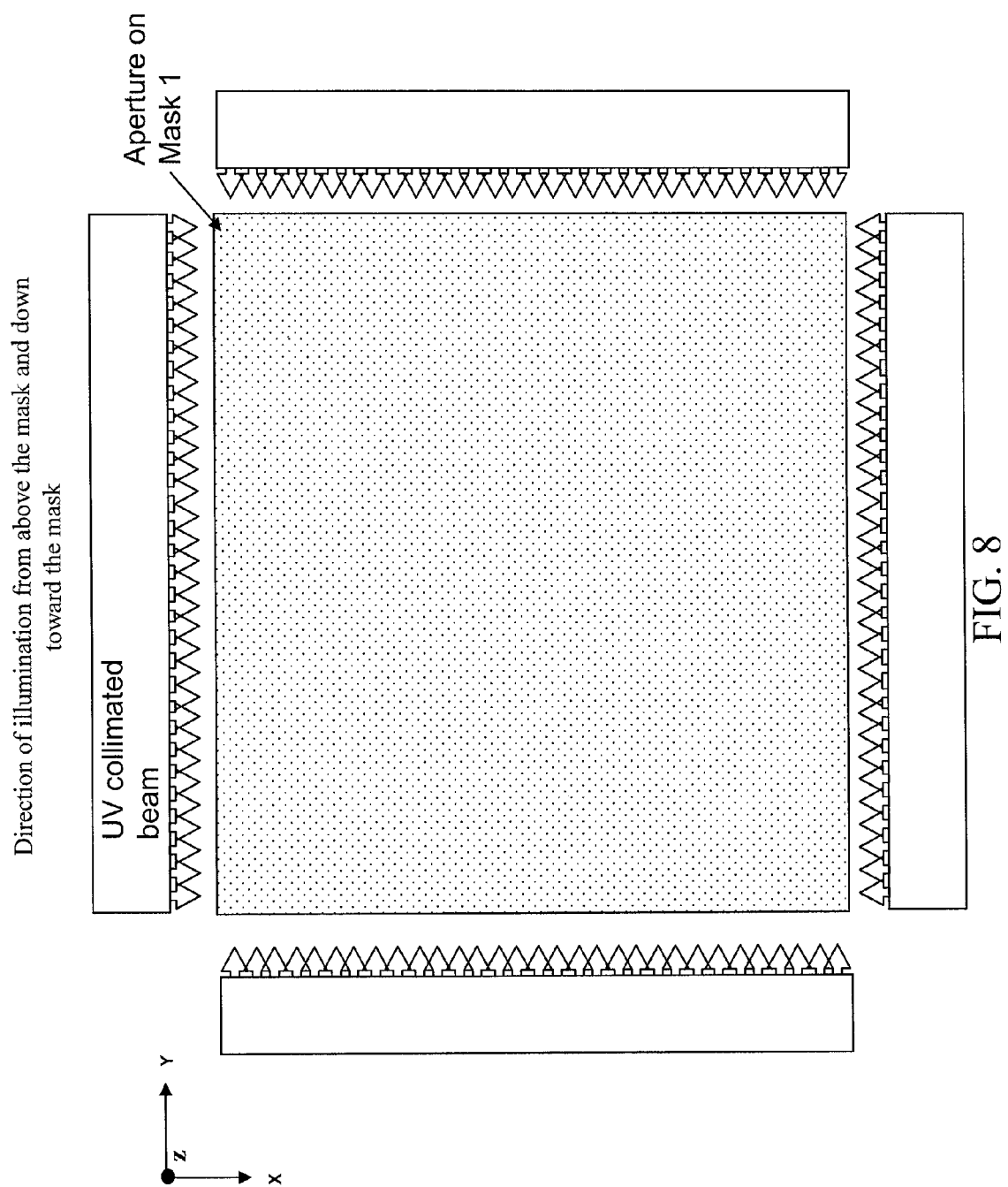
FIG. 8 illustrates a top view schematic of a system for forming a functionally graded 3D ordered open-cellular microstructure according to an embodiment of the present invention.

To create a functionally graded open-cellular 3D microstructure (i.e. a microstructure that has a spatial variation through the thickness of the material), a similar configuration as shown and described above in FIG. 3 is used; however, the volume of photosensitive monomer is exposed to two different three-dimensional patterns of light on opposite sides of the monomer. FIG. 7 is a two-dimensional side view schematic of such a three-dimensional configuration according to an embodiment of the present invention. That is, FIG. 7 is a side view schematic of an example setup used to create functionally graded material with an ordered open-cellular 3D microstructure. The top exposure surface has multiple collimated beams at an angle $\alpha$ off the x-y plane and the bottom exposure surface has multiple collimated beams at an angle $-\beta$ off the x-y plane. Here, as in FIG. 3, the embodiment of FIG. 7 includes a mask (Mask 1) with a pattern of apertures to create a 3D light pattern from multiple collimated beams (as shown in FIG. 8). However, unlike FIG. 3, in FIG. 7, two masks (Mask 1 and Mask 2) are shown be on opposite sides of the monomer mold/reservoir, and multiple collimated beams would expose the monomer through each respective mask creating two exposure surfaces.

FIG. 8 shows a top view schematic of example setup utilized to create a functionally graded material with an ordered open-cellular 3D microstructure. In FIG. 8, the example setup contains a square mold and four collimated exposure beams each rotated 90° about the z-axis.

Figure 9A:
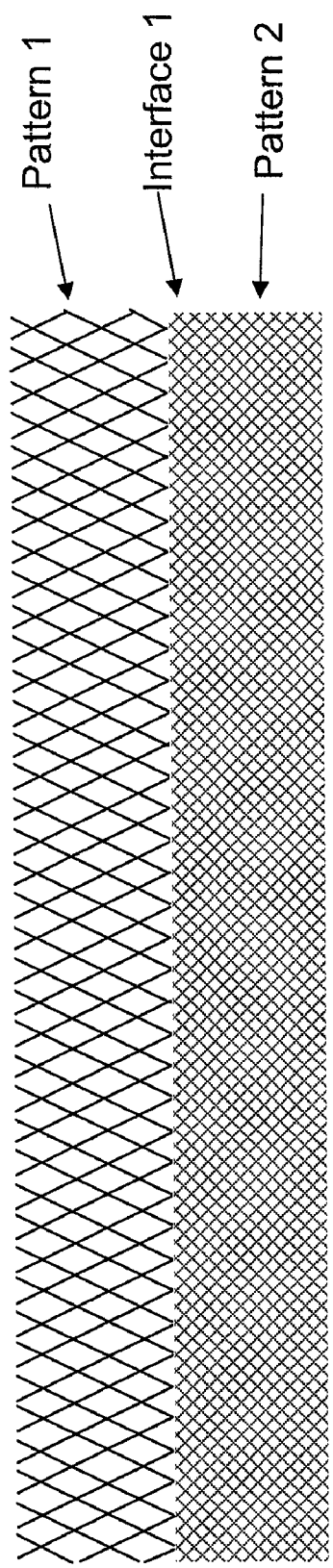
FIGS. 9a, 9b, and 9c represent 2D schematics of three-dimensional functionally graded microstructures according to embodiments of the present invention.
Figure 9B:
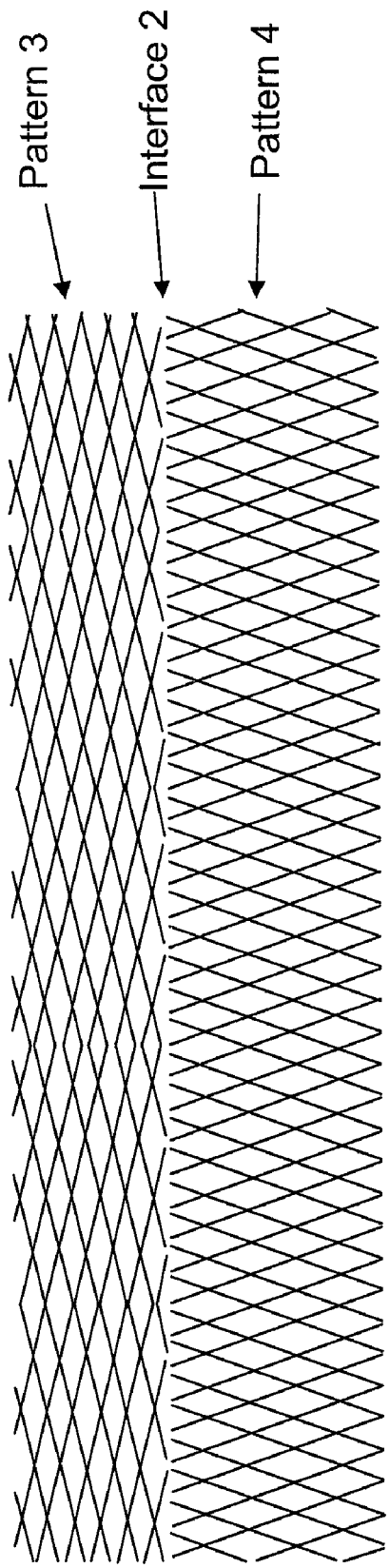
Figure 9C:
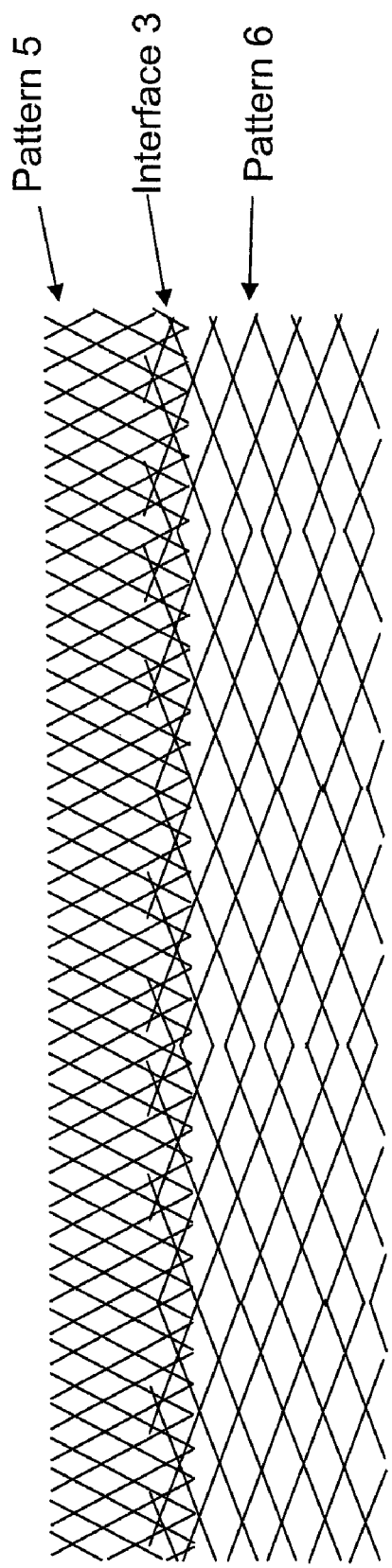

The open-cellular microstructure formed at each exposure surface will depend on the incident light angles as well as the mask pattern, so by suitably varying these light angles and/or the mask pattern different microstructures can be formed. Since the waveguides are initially formed at the exposure surface of the monomer and propagate away from this exposure surface, the exposure time and/or incident energy of the light can be suitably varied such that the two distinct microstructures formed at the two exposure surfaces will "connect," or intersect at some interface layer between the two exposure surfaces. This interface layer can have a thickness less than the unit cell thickness of either microstructure—i.e. just thick enough to form a physical connection between the two microstructures (as shown in FIGS. 9a and 9b)—or the two microstructures can overlap, creating an interface with its own distinct microstructure and thickness (as shown in FIG. 9c). That is, FIGS. 9a, 9b, and 9c represent 2D schematics of three-dimensional functionally graded microstructures that can be formed through the above described technique according to embodiments of the present invention.

By utilizing the described technique, an interconnected pattern of self-propagating polymer optical waveguides can form a single, continuous open-cellular polymer that has at least two distinct, yet ordered 3D microstructures through its thickness, thus created a functionally graded structure. That is, an embodiment of the present invention provides a functionally graded 3D ordered open-cellular polymer microstructure. By "designing" an ordered open-cellular polymer microstructure with an ordered three-dimensional pattern that varies through the thickness of the material, a variety of new material microstructures are possible.

As envisioned, the functionally graded 3D open-cellular polymer microstructure can be used as is, or because it is open-cellular, the polymer microstructure can be used as a template to create other materials with functionally graded microstructures.

Another embodiment of the present invention is directed toward a method to fabricate the functionally graded 3D ordered open-cellular microstructure. Here, the method has a simplicity that can enable the formation of these functionally graded 3D ordered open-cellular microstructures on a large, useful scale. The simplicity in the method to fabricate the functionally graded 3D ordered open-cellular microstructure, as well as the versatility in end material options, makes embodiments of the present invention useful for a number of automotive and aerospace applications including controlled energy absorbing structures, variable wicking structures, graded thermal management materials, among others.

Figure 10:
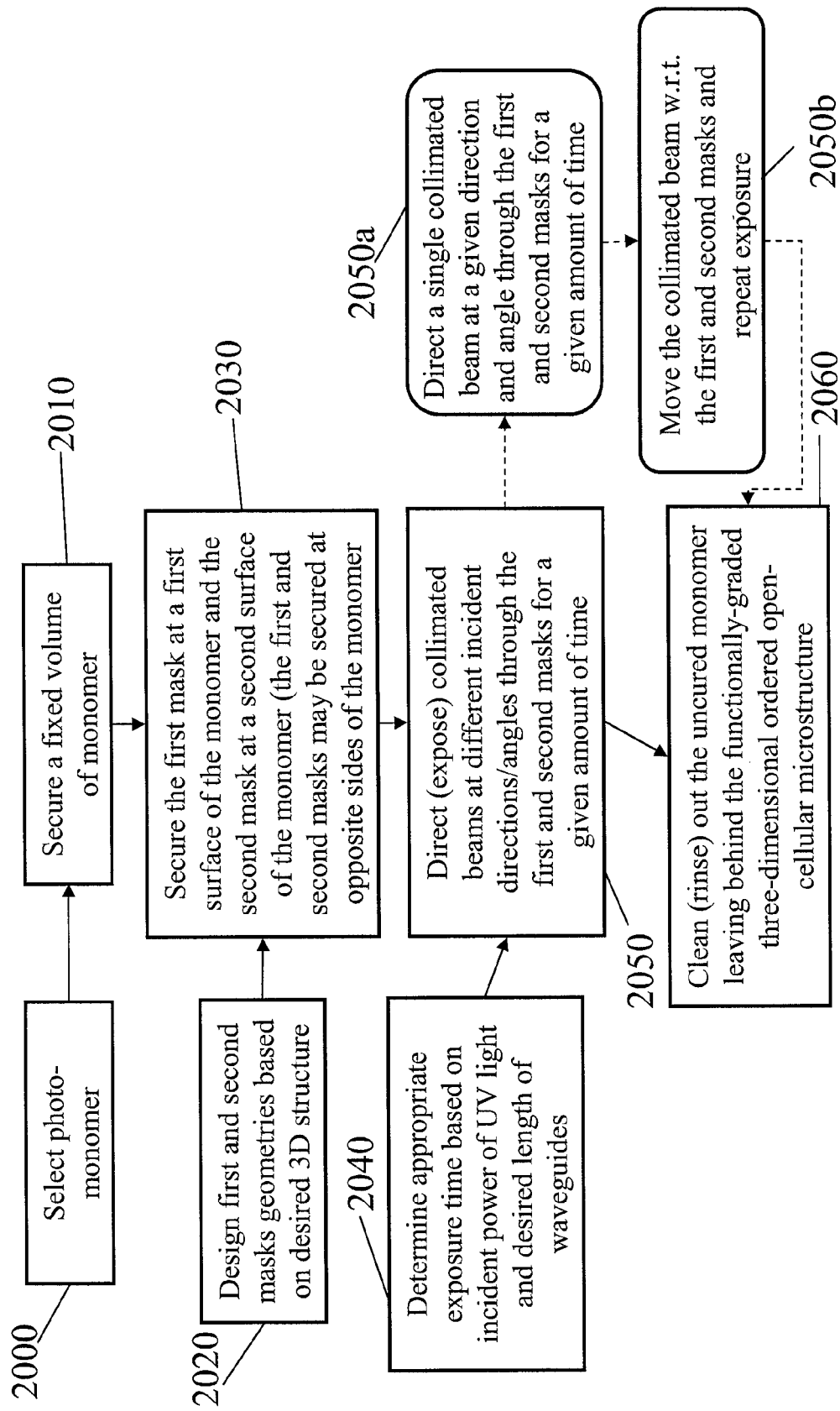
FIG. 10 is a process flow diagram for forming a functionally graded 3D ordered open-cellular microstructure according to an embodiment of the present invention.

In more detail, FIG. 10 shows a method of forming a 3D ordered microstructure according to an embodiment of the present invention. As illustrated in FIG. 10, a photo-monomer is selected in block 2000. In block 2010, a volume of the selected photo-monomer is secured (e.g., in a reservoir). A first mask geometry and a second mask geometry are designed based on a desired 3D structure in block 2020. The first mask having the designed geometry is secured at a first surface of the monomer, and the second mask is secured at a second surface of the monomer in block 2030. Here, the first and second masks may be secured at opposite sides of the monomer as shown in FIG. 7. In addition, the secured first mask has at least one first aperture between at least one first collimated light source and the volume of the selected photo-monomer, and the secured second mask has at least one second aperture between at least one second collimated light source and the volume of the selected photo-monomer. Further, the first and second masks may be in contact with the monomer or separated by substrates (e.g., by UV transparent substrates).

In block 2040, an appropriate exposure time is determined based on incident power of collimated light beams from the first and second collimated light sources (e.g., incident powers of UV lights), and a desired length of one or more waveguides of the first mask and a desired length of one or more waveguides of the second mask. The collimated light beams from the first and second collimated light sources are respectively directed to the first and second masks for a period of exposure time so that a first portion of the collimated beam passes through the first mask and is guided by the at least one first aperture into the photo-monomer to form at least one first waveguide through a portion of the volume of the photo-monomer, and a second portion of the collimated beam passes through the second mask and is guided by the at least one second aperture into the photo-monomer to form at least one second waveguide through a portion of the volume of the photo-monomer. Here, the first waveguide has a cross-sectional geometry substantially matching the designed aperture geometry on the first mask, and the second waveguide has a cross-sectional geometry substantially matching the designed aperture geometry on the second mask.

In one embodiment as shown in block 2050, multiple collimated beams at different incident directions and/or angles are directed through the first and second masks for a given amount of time.

Alternatively, as shown in blocks 2050a, a single first collimated beam at a given direction and angle is directed through the first mask for a given amount of time, and a single second collimated beam at a given direction and angle is directed through the second mask for a given amount of time. Then, at block 2050b, the single first collimated light beam is moved with respect to the first mask, the single second collimated light beam is moved with respect to the second mask, and the exposures are repeated.

Then, at block 2060, any uncured photo-monomer is removed to leave behind a functionally-graded three-dimensional ordered open-cellular microstructure. Here, in one embodiment, the plurality of polymer first waveguides and the plurality of second waveguides are used to form the functionally-graded three-dimensional ordered open-cellular microstructure, and the functionally-graded three-dimensional ordered open-cellular microstructure corresponds with the pattern of the plurality of first apertures and the plurality of second apertures.

The resulting functionally-graded three-dimensional ordered open-cellular microstructure can be formed in seconds in the area where exposed to the incident collimated beam. Since the incident light and the monomer remain fixed with respect to one another during the formation of a polymer waveguide, the exposure area of the collimated beam(s) can be scanned over a larger surface area of monomer, leading to the formation of large-area structures. Alternatively, in one embodiment, a volume of monomer can continuously be fed under a fixed incident light pattern (created from a mask and collimated light) leading to a path for mass production. As such, an interconnected pattern of self-propagating polymer optical waveguides are utilized to form a single, continuous open-cellular polymer that has at least two distinct, yet ordered 3D microstructures through its thickness, thus creating the functionally-graded three-dimensional ordered open-cellular microstructure.

As described, once the functionally-graded three-dimensional ordered open-cellular microstructure is formed in the volume of monomer, the remaining un-polymerized material (monomer) is removed leaving an open cellular polymer material that is the functionally-graded three-dimensional ordered open-cellular microstructure. By way of example, a solvent that dissolves the monomer (but not the polymer) may be used to aid in the monomer removal.

An embodiment of the present invention provides a method for forming a functionally-graded three-dimensional ordered open-cellular microstructure. Here, the method includes: securing a volume of photo-monomer; exposing the volume of photo-monomer to a first three-dimensional light pattern and a second three-dimensional light pattern differing from the first three-dimensional light pattern, wherein the first three-dimensional light pattern and the second three-dimensional light pattern are exposed on opposite exposure surfaces of the volume of photo-monomer, wherein the first three-dimensional light pattern creates a first three-dimensional interconnected pattern of polymer waveguides in the volume of photo-monomer, wherein the second three-dimensional light pattern creates a second three-dimensional interconnected pattern of polymer waveguides in the volume of photo-monomer, and wherein an exposure energy of each of the light patterns is sufficient to at least connect the first three-dimensional interconnected pattern of polymer waveguides to the second three-dimensional interconnected pattern of polymer waveguides; and removing any uncured photo-monomer to leave behind the functionally-graded three-dimensional ordered open-cellular microstructure.

In one embodiment, the exposure energy of each of the light patterns determines a thickness into the volume of photo-monomer of each of the interconnected patterns of polymer waveguides originating from a respective one of the exposure surfaces of the photo-monomer.

In one embodiment, the exposing the volume of photo-monomer to the first three-dimensional light pattern and the second three-dimensional light pattern includes: securing a first mask at a first one of the opposite exposure surfaces of the volume of photo-monomer, the first mask having a plurality of first apertures arranged in a first mask pattern; and securing a second mask at a second one of the opposite exposure surfaces of the volume of photo-monomer, the second mask having a plurality of second apertures arranged in a second mask pattern differing from the first mask pattern. The securing the first mask at the first one of the opposite exposure surfaces of the photo-monomer may include placing the first mask between a first collimated light source and the first one of the opposite exposure surfaces of the photo-monomer, and the securing the second mask at the second one of the opposite exposure surfaces of the photo-monomer may include placing the second mask between a second collimated light source and the second one of the opposite exposure surfaces of the photo-monomer.

In one embodiment, the exposing the volume of photo-monomer to the first three-dimensional light pattern and the second three-dimensional light pattern includes: directing a plurality of first collimated light beams from the first collimated light source to the first mask for a period of exposure time such that a portion of the first collimated light beams passes through the plurality of first apertures of the first mask into the photo-monomer to form the first three-dimensional interconnected pattern of polymer waveguides through a first portion of the volume of the photo-monomer; and directing a plurality of second collimated light beams from the second collimated light source to the second mask for a period of exposure time such that a portion of the second collimated light beams passes through the plurality of second apertures of the first mask into the photo-monomer to form the second three-dimensional interconnected pattern of polymer waveguides through a second portion of the volume of the photo-monomer. The directing the plurality of first collimated light beams from the first collimated light source to the first mask may include directing a first one of the plurality of first collimated light beams at a first angle with respect to the first mask, directing a second one of the plurality of first collimated light beams at a second angle with respect to the first mask, and directing a third one of the plurality of first collimated light beams at a third angle with respect to the first mask; and the directing the plurality of second collimated light beams from the second collimated light source to the second mask may include directing a first one of the plurality of second collimated light beams at a fourth angle with respect to the second mask, directing a second one of the plurality of second collimated light beams at a fifth angle with respect to the second mask, and directing a third one of the plurality of second collimated light beams at a sixth angle with respect to the second mask.

In one embodiment, the first angle is different from the fourth angle, the second angle is different from the fifth angle, and/or the third angle is different from the sixth angle; and the plurality of first apertures is substantially identical in number to the plurality of second apertures.

In one embodiment, the first angle is substantially identical to the fourth angle, the second angle is substantially identical to the fifth angle, and the third angle is substantially identical to the sixth angle; and the plurality of first apertures is different in number to the plurality of second apertures.

In one embodiment, the first angle is different from the fourth angle, the second angle is different from the fifth angle, and/or the third angle is different from the sixth angle; and the plurality of first apertures is different in number to the plurality of second apertures.

In one embodiment, the first collimated light source includes three or more light sources adapted to produce the first, second and third ones of the plurality of first collimated light beams, and the second collimated light source includes three or more light sources adapted to respectively produce the first, second and third ones of the plurality of second collimated light beams. The first three-dimensional interconnected pattern of polymer waveguides and the second three-dimensional interconnected pattern of polymer waveguides may be formed from a concurrent exposure of the first, second and third ones of the plurality of first collimated light beams and the first, second and third ones of the plurality of second collimated light beams.

In one embodiment, the exposing the volume of photo-monomer to the first three-dimensional light pattern and the second three-dimensional light pattern further includes: directing three or more first collimated light beams from the first collimated light source to the first mask for a period of exposure time such that a portion of the first collimated light beams passes through the plurality of first apertures of the first mask into the photo-monomer to form the first three-dimensional interconnected pattern of polymer waveguides through a first portion of the volume of the photo-monomer; and directing three or more second collimated light beams from the second collimated light source to the second mask for a period of exposure time such that a portion of the second collimated light beam passes through the plurality of second apertures of the second mask into the photo-monomer to form the second three-dimensional interconnected pattern of polymer waveguides through a second portion of the volume of the photo-monomer.

In one embodiment, the second three-dimensional interconnected pattern of polymer waveguides is formed entirely within the first three-dimensional interconnected pattern of polymer waveguides. Here, the first three-dimensional interconnected pattern of polymer waveguides and the second three-dimensional interconnected pattern of polymer waveguides may be substantially identical in volume.

In one embodiment, the second three-dimensional interconnected pattern of polymer waveguides has a first portion formed within the first three-dimensional interconnected pattern of polymer waveguides and a second portion formed outside of the first three-dimensional interconnected pattern of polymer waveguides.

Referring now back to FIG. 7, an embodiment of the present invention provides a system for forming a functionally-graded three-dimensional ordered open-cellular microstructure. The system includes a reservoir, a first patterning apparatus, and a second patterning apparatus. The reservoir has a volume of photo-monomer adapted to polymerize by the collimated light beams. The first patterning apparatus is adapted to expose the volume of photo-monomer to a first three-dimensional light pattern. The second patterning apparatus is adapted to expose the volume of photo-monomer to a second three-dimensional light pattern. Here, the first three-dimensional light pattern and the second three-dimensional light pattern are exposed on opposite exposure surfaces of the volume of photo-monomer, the first three-dimensional light pattern creates a first three-dimensional interconnected pattern of polymer waveguides, the second three-dimensional light pattern creates a second three-dimensional interconnected pattern of polymer waveguides, and an exposure energy of each of the light patterns is sufficient to at least connect the first three-dimensional interconnected pattern of polymer waveguides to the second three-dimensional interconnected pattern of polymer waveguides.

In one embodiment, the exposure energy of each of the light patterns determines a thickness into the volume of photo-monomer of each of the interconnected patterns of polymer waveguides formed starting at a respective one of the exposure surfaces of the photo-monomer.

In one embodiment, the first patterning apparatus includes a first collimated light source adapted to produce a plurality of first collimated light beams, and a first mask disposed between the first collimated light source and a first one of the opposite exposure surfaces of the volume of photo-monomer, the first mask having a plurality of first apertures with a first mask pattern. The second patterning apparatus includes a second collimated light source adapted to produce a plurality of second collimated light beams, and a second mask disposed between the second collimated light source and a second one of the opposite exposure surfaces of the volume of photo-monomer, the second mask having a plurality of second apertures with a second mask pattern.

In one embodiment, the first collimated light source may include a plurality of first light sources adapted to respectively produce the plurality of first collimated beams, and the second collimated light source may include a plurality of second light sources adapted to respectively produce the plurality of second collimated beams.

In one embodiment, the plurality of first collimated beams includes a first beam directed at a first angle with respect to the first mask, a second beam directed at a second angle with respect to the first mask, and a third beam directed at a third angle with respect to the first mask. The plurality of second collimated beams includes a fourth beam directed at a fourth angle with respect to the second mask, a fifth beam directed at a fifth angle with respect to the second mask, and a sixth beam directed at a sixth angle with respect to the second mask.

In one embodiment, the first angle is different from the fourth angle, the second angle is different from the fifth angle, and/or the third angle is different from the sixth angle; and the plurality of first apertures is substantially identical in number to the plurality of second apertures.

In one embodiment, the first angle is substantially identical to the fourth angle, the second angle is substantially identical to the fifth angle, and the third angle is substantially identical to the sixth angle; and the plurality of first apertures is different in number to the plurality of second apertures.

In one embodiment, the first angle is different from the fourth angle, the second angle is different from the fifth angle, and/or the third angle is different from the sixth angle; and the plurality of first apertures is different in number to the plurality of second apertures.

In one embodiment, the second three-dimensional interconnected pattern of polymer waveguides is formed entirely within the first three-dimensional interconnected pattern of polymer waveguides. Here, the first three-dimensional interconnected pattern of polymer waveguides and the second three-dimensional interconnected pattern of polymer waveguides may be substantially identical in volume.

In one embodiment, the second three-dimensional interconnected pattern of polymer waveguides has a first portion formed within the first three-dimensional interconnected pattern of polymer waveguides and a second portion formed outside of the first three-dimensional interconnected pattern of polymer waveguides.

In one embodiment, the exposure energy of each of the light patterns determines a thickness into the volume of photo-monomer of each of the interconnected patterns of polymer waveguides formed starting at a respective one of the exposure surfaces of the photo-monomer.

In one embodiment, the first patterning apparatus includes a first collimated light source adapted to produce a plurality of first collimated light beams, and a first mask (Mask 1) disposed between the first collimated light source and a first one of the opposite exposure surfaces of the volume of photo-monomer, the first mask having a plurality of first apertures with a first mask pattern. The second patterning apparatus includes a second collimated light source adapted to produce a plurality of second collimated light beams, and a second mask (Mask 2) disposed between the second collimated light source and a second one of the opposite exposure surfaces of the volume of photo-monomer, the second mask having a plurality of second apertures with a second mask pattern.

In one embodiment, the first collimated light source may include a plurality of first light sources adapted to respectively produce the plurality of first collimated beams, and the second collimated light source may include a plurality of second light sources adapted to respectively produce the plurality of second collimated beams.

In one embodiment, the plurality of first collimated beams includes a first beam directed at a first angle with respect to the first mask, a second beam directed at a second angle with respect to the first mask, and a third beam directed at a third angle with respect to the first mask. The plurality of second collimated beams includes a fourth beam directed at a fourth angle with respect to the second mask, a fifth beam directed at a fifth angle with respect to the second mask, and a sixth beam directed at a sixth angle with respect to the second mask. In addition, the first angle is different from the fourth angle, the second angle is different from the fifth angle, and/or the third angle is different from the sixth angle.

In one embodiment, the first collimated light source includes first, second, and third light sources adapted to respectively produce first, second and third ones of the plurality of first collimated light beams, and the second collimated light source includes fourth, fifth, and sixth light sources adapted to respectively produce first, second and third ones of the plurality of second collimated light beams. The first three-dimensional interconnected pattern of polymer waveguides and the second three-dimensional interconnected pattern of polymer waveguides may be formed from a concurrent exposure of the first, second and third ones of the plurality of first collimated light beams and the first, second and third ones of the plurality of second collimated light beams.

Referring now back to FIGS. 9a, 9b, and/or 9c, an embodiment of the present invention provides a functionally-graded three-dimensional ordered open-cellular microstructure. The functionally-graded three-dimensional ordered open-cellular microstructure includes a first three-dimensional interconnected pattern of polymer waveguides having a first three-dimensional pattern (Pattern 1, Pattern 3, Pattern 5); a second three-dimensional interconnected pattern of polymer waveguides having a second three-dimensional pattern differing from the first three-dimensional pattern (Pattern 2, Pattern 4, Pattern 6); and an interface (Interface 1, Interface 2, Interface 3) connected with the first three-dimensional interconnected pattern of polymer waveguides and the second three-dimensional interconnected pattern of polymer waveguides.

In one embodiment, the interface is a third three-dimensional interconnected pattern of polymer waveguides (Interface 3) having a third three-dimensional pattern differing from the first three-dimensional pattern and the second three-dimensional pattern.

In one embodiment, the first and second three-dimensional patterns have order in three dimensions (see also FIG. 2).

In one embodiment, the functionally-graded three-dimensional ordered open-cellular microstructure also includes: a plurality of first truss elements defined by a plurality of first self-propagating polymer waveguides of the first three-dimensional interconnected pattern of polymer waveguides and extending along a first direction; a plurality of second truss elements defined by a plurality of second self-propagating polymer waveguides of the first three-dimensional interconnected pattern of polymer waveguides and extending along a second direction; a plurality of third truss elements defined by a plurality of third self-propagating polymer waveguides of the first three-dimensional interconnected pattern of polymer waveguides and extending along a third direction; a plurality of fourth truss elements defined by a plurality of fourth self-propagating polymer waveguides of the second three-dimensional interconnected pattern of polymer waveguides and extending along a fourth direction; a plurality of fifth truss elements defined by a plurality of fifth self-propagating polymer waveguides of the second three-dimensional interconnected pattern of polymer waveguides and extending along a fifth direction; and a plurality of sixth truss elements defined by a plurality of sixth self-propagating polymer waveguides of the first three-dimensional interconnected pattern of polymer waveguides and extending along a sixth direction. The first, second, and third truss elements interpenetrate each other at a plurality of first nodes to form a first continuous material, the fourth, fifth, and sixth truss elements interpenetrate each other at a plurality of second nodes to form a first continuous material, and the interface includes a plurality of third nodes for connecting the first continuous material to the second continuous material.

In view of the foregoing, a method for forming a functionally graded polymer material with an ordered open-cellular three-dimensional (3D) microstructure from an interconnected pattern of self-propagating polymer optical waveguides according to one embodiment of the present invention is provided. The method includes securing a volume of photo-monomer; exposing the volume of photo-monomer to two different three-dimensional light patterns on opposite surfaces of the monomer, wherein each light pattern creates a different three-dimensional interconnected pattern of polymer waveguides and the exposure energy for each pattern is sufficient to at least connect the two distinct patterns of polymer waveguides; removing the uncured liquid photo-monomer resulting in a functionally graded open-cellular polymer material. In one embodiment, the thickness of each interconnected pattern of polymer waveguides formed at each exposure surface is determined by the exposure energy of each respective light pattern.

In addition, a functionally graded three-dimensional open-cellular polymer material according to an embodiment of the present invention includes a plurality of waveguides. The waveguides are interconnected in at least two distinct three-dimensional patterns, and the at least two waveguide patterns are connected at an interface. In one embodiment, the interface is a distinct three-dimensional pattern of interconnected waveguides. In one embodiment, the at least two distinct patterns have order in three dimensions.

While certain exemplary embodiments have been described in detail and shown in the accompanying drawings, it is to be understood that such embodiments are merely illustrative of and not restrictive of the broad invention. It will thus be recognized by a person skilled in the art that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims and equivalents thereof.

What is claimed is:

1. A method for forming a functionally-graded three-dimensional ordered open-cellular microstructure, the method comprising:
   securing a volume of photo-monomer;
   exposing the volume of photo-monomer to a first three-dimensional light pattern and a second three-dimensional light pattern differing from the first three-dimensional light pattern, wherein the first three-dimensional light pattern and the second three-dimensional light pattern are exposed on opposite exposure surfaces of the volume of photo-monomer, wherein the first three-dimensional light pattern creates a first three-dimensional interconnected pattern of polymer waveguides in the volume of photo-monomer, wherein the second three-dimensional light pattern creates a second three-dimensional interconnected pattern of polymer waveguides in the volume of photo-monomer, and wherein an exposure energy of each of the light patterns is sufficient to at least connect the first three-dimensional interconnected pattern of polymer waveguides to the second three-dimensional interconnected pattern of polymer waveguides; and
   removing any uncured photo-monomer to leave behind the functionally-graded three-dimensional ordered open-cellular microstructure.

2. The method of claim 1, wherein the exposure energy of each of the light patterns determines a thickness into the volume of photo-monomer of each of the interconnected patterns of polymer waveguides originating from a respective one of the exposure surfaces of the photo-monomer.

3. The method of claim 1, wherein the exposing the volume of photo-monomer to the first three-dimensional light pattern and the second three-dimensional light pattern comprises:
   securing a first mask at a first one of the opposite exposure surfaces of the volume of photo-monomer, the first mask having a plurality of first apertures arranged in a first mask pattern; and
   securing a second mask at a second one of the opposite exposure surfaces of the volume of photo-monomer, the second mask having a plurality of second apertures arranged in a second mask pattern differing from the first mask pattern.

4. The method of claim 3, wherein the securing the first mask at the first one of the opposite exposure surfaces of the photo-monomer comprises placing the first mask between a first collimated light source and the first one of the opposite exposure surfaces of the photo-monomer, and wherein the securing the second mask at the second one of the opposite exposure surfaces of the photo-monomer comprises placing the second mask between a second collimated light source and the second one of the opposite exposure surfaces of the photo-monomer.

5. The method of claim 4, wherein the exposing the volume of photo-monomer to the first three-dimensional light pattern and the second three-dimensional light pattern further comprises:
   directing a plurality of first collimated light beams from the first collimated light source to the first mask for a period of exposure time such that a portion of the first collimated light beams passes through the plurality of first apertures of the first mask into the photo-monomer to form the first three-dimensional interconnected pattern of polymer waveguides through a first portion of the volume of the photo-monomer; and
   directing a plurality of second collimated light beams from the second collimated light source to the second mask for a period of exposure time such that a portion of the second collimated light beams passes through the plurality of second apertures of the first mask into the photo-monomer to form the second three-dimensional interconnected pattern of polymer waveguides through a second portion of the volume of the photo-monomer.

6. The method of claim 5, wherein the directing the plurality of first collimated light beams from the first collimated light source to the first mask comprises directing a first one of the plurality of first collimated light beams at a first angle with respect to the first mask, directing a second one of the plurality of first collimated light beams at a second angle with respect to the first mask, and directing a third one of the plurality of first collimated light beams at a third angle with respect to the first mask; wherein the directing the plurality of second collimated light beams from the second collimated light source to the second mask comprises directing a first one of the plurality of second collimated light beams at a fourth angle with respect to the second mask, directing a second one of the plurality of second collimated light beams at a fifth angle with respect to the second mask, and directing a third one of the plurality of second collimated light beams at a sixth angle with respect to the second mask.

7. The method of claim 6, wherein the first angle is different from the fourth angle, the second angle is different from the fifth angle, and/or the third angle is different from the sixth angle, and wherein the plurality of first apertures is substantially identical in number to the plurality of second apertures.

8. The method of claim 6, wherein the first angle is substantially identical to the fourth angle, the second angle is substantially identical to the fifth angle, and the third angle is substantially identical to the sixth angle, and wherein the plurality of first apertures is different in number to the plurality of second apertures.

9. The method of claim 6, wherein the first angle is different from the fourth angle, the second angle is different from the fifth angle, and/or the third angle is different from the sixth angle, and wherein the plurality of first apertures is different in number to the plurality of second apertures.

10. The method of claim 6, wherein the first collimated light source comprises three or more light sources adapted to produce the first, second and third ones of the plurality of first collimated light beams, and wherein the second collimated light source comprises three or more light sources adapted to respectively produce the first, second and third ones of the plurality of second collimated light beams.

11. The method of claim 10, wherein the first three-dimensional interconnected pattern of polymer waveguides and the second three-dimensional interconnected pattern of polymer waveguides are formed from a concurrent exposure of the first, second and third ones of the plurality of first collimated light beams and the first, second and third ones of the plurality of second collimated light beams.

12. The method of claim 4, wherein the exposing the volume of photo-monomer to the first three-dimensional light pattern and the second three-dimensional light pattern further comprises:

directing three or more first collimated light beams from the first collimated light source to the first mask for a period of exposure time such that a portion of the first collimated light beams passes through the plurality of first apertures of the first mask into the photo-monomer to form the first three-dimensional interconnected pattern of polymer waveguides through a first portion of the volume of the photo-monomer; and directing three or more second collimated light beams from the second collimated light source to the second mask for a period of exposure time such that a portion of the second collimated light beam passes through the plurality of second apertures of the second mask into the photo-monomer to form the second three-dimensional interconnected pattern of polymer waveguides through a second portion of the volume of the photo-monomer.

13. The method of claim 1, wherein the second three-dimensional interconnected pattern of polymer waveguides is formed entirely within the first three-dimensional interconnected pattern of polymer waveguides.

14. The method of claim 13, wherein the first three-dimensional interconnected pattern of polymer waveguides and the second three-dimensional interconnected pattern of polymer waveguides are substantially identical in volume.

15. The method of claim 1, wherein the second three-dimensional interconnected pattern of polymer waveguides has a first portion formed within the first three-dimensional interconnected pattern of polymer waveguides and a second portion formed outside of the first three-dimensional interconnected pattern of polymer waveguides.

16. A system for forming a functionally-graded three-dimensional ordered open-cellular microstructure, the system comprising:

a reservoir having a volume of photo-monomer adapted to polymerize by collimated light beams; and a first patterning apparatus adapted to expose the volume of photo-monomer to a first three-dimensional light pattern;

a second patterning apparatus adapted to expose the volume of photo-monomer to a second three-dimensional light pattern, wherein the first three-dimensional light pattern and the second three-dimensional light pattern are exposed on opposite exposure surfaces of the volume of photo-monomer, wherein the first three-dimensional light pattern creates a first three-dimensional interconnected pattern of polymer waveguides, wherein the second three-dimensional light pattern creates a second three-dimensional interconnected pattern of polymer waveguides, and wherein an exposure energy of each of the light patterns is sufficient to at least connect the first three-dimensional interconnected pattern of polymer waveguides to the second three-dimensional interconnected pattern of polymer waveguides.

* * * * *